United States Patent [19]

Pammer

[11] Patent Number: 4,811,170
[45] Date of Patent: Mar. 7, 1989

[54] FILM-MOUNTED CIRCUIT AND METHOD FOR FABRICATING THE SAME

[75] Inventor: Erich Pammer, Taufkirchen, Fed. Rep. of Germany

[73] Assignee: Siemens Aktiengesellschaft, Berlin and Munich, Fed. Rep. of Germany

[21] Appl. No.: 832,032

[22] Filed: Feb. 21, 1986

[30] Foreign Application Priority Data

Feb. 25, 1985 [DE] Fed. Rep. of Germany ....... 3506581

[51] Int. Cl.$^4$ .............................................. H05K 1/09
[52] U.S. Cl. ....................................... 361/400; 29/840
[58] Field of Search .................... 361/400, 403, 406; 29/840, 843, DIG. 12; 228/124 R, 124 H, 123, 180.1, 180.2, 254; 204/14.1

[56] References Cited

U.S. PATENT DOCUMENTS 3,621,564 11/1971 Tanaka et al. ................. 228/123 X
3,680,198 8/1972 Wood .
4,259,436 3/1981 Tabuchi et al. .

FOREIGN PATENT DOCUMENTS 2414297 10/1975 Fed. Rep. of Germany .
3343367 6/1985 Fed. Rep. of Germany .
1159979 7/1969 United Kingdom .

OTHER PUBLICATIONS

Patent Abstract of Japan, vol. 6, No. 151, Aug. 1982.
Machine Design, vol. 43, No. 1, Jan. 7, 1971, p. 28.

Publication "Constitution of Binary Alloys" by Max Hansen, 1958.

Primary Examiner—Arthur T. Grimley
Assistant Examiner—D. A. Tone
Attorney, Agent, or Firm—Herbert L. Lerner; Laurence A. Greenberg

[57] ABSTRACT

A film-mounted circuit includes a support film, metallic conductor runs formed of solderable material disposed on the support film, the conductor runs each having two ends, a contact area containing solder material electroplated on one of the ends and external terminal contacts containing solder material electroplated on the other of the ends for receiving a solder connection to external wiring, and a metallic semiconductor chip having hump-like terminal contacts each having a side with a surface area soldered to a respective one of the contact areas, the terminal contacts being formed of solderable material at least at the surface area thereof, the solderable material of the surface area of the terminal contacts forming an alloy together with the solder material of the contact areas deposited by electroplating during soldering, the alloy having an alloy ratio defined by a eutectic point, the melting point temperature of which is at least 20° C. above the melting point temperature of the solder material of the external terminal contacts but below a temperature at which the semiconductor chip is thermally damaged by the soldering, and a method of fabricating the same.

13 Claims, 3 Drawing Sheets

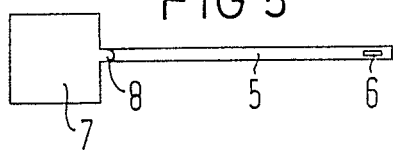
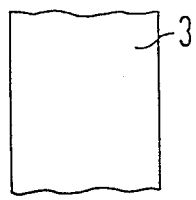
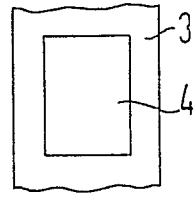
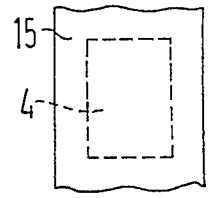
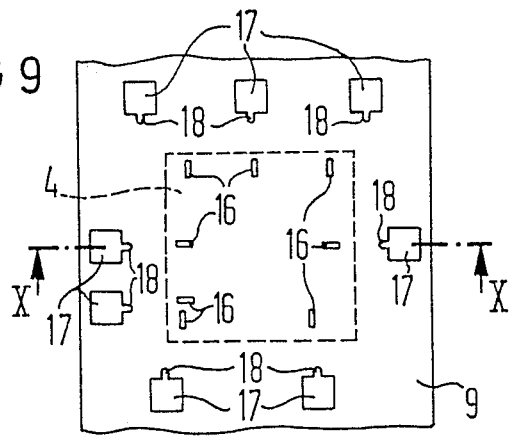
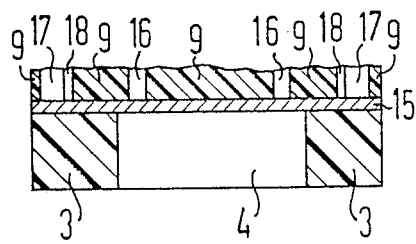
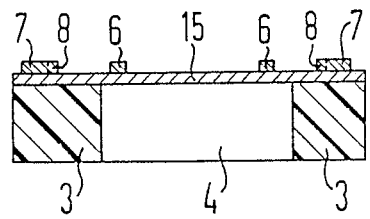

FILM-MOUNTED CIRCUIT AND METHOD FOR FABRICATING THE SAME

The invention relates to a film-mounted circuit or micropack and a method for fabricating the same with a support film on which metallic conductor runs of solderable material are provided by coating one entire principal surface of the support film with a metal foil formed of solderable material, in such a manner that contact areas are provided at one end of each conductor run, and external terminal contacts are provided on the other end of each conductor run, which are formed by solder material and serve for a solder connection to external wiring, and a metallic semiconductor chip having bump or hump-like terminal contacts, the terminal contacts being soldered to the contact areas and formed of solderable material at least in a surface area of a side thereof which is soldered to the contact areas.

Film-mounted circuits, which are also known as micropacks, have become as well known in the semiconductor industry as circuits with conventional ceramic or plastic casings.

German Published, Non-Prosecuted Application DE-OS No. 33 43 367, corresponding to U.S. application Ser. No. 663,364, filed Oct. 22, 1984, briefly describes the basic structure of a micropack. The micropack essentially contains a support film and a semiconductor chip. Electrical connections between the support film and the semiconductor chip can be established by soldering, for example. Usually, the support film contains predominantly plastic and frequently kapton. In addition, the support film generally also includes metallic conductor runs of a spider type, one end or contact area of which can be connected to the semiconductor chip by known methods such as thermo-compression and soldering, and the other end of which serves as an external lead contact for further use. Micropacks can be used on circuit boards, for instance. The necessary electrical connections which serve at the same time for mechanical stabilization, are made by soldered wire connections between conductor runs or solder support points of the circuit boards and the external lead contacts of the micropacks.

Both soldering processes, namely the establishment of the connections between the conductor runs of the circuit boards and the external terminals of the micropack as well as the soldering of the semiconductor chips to the spider-like metallic conductor runs of the support film, take place spatially close together as is well known. There is a great danger that during the soldering to the external lead contacts of the micropack, the amount of heat supplied at that location, such as by means of heat transport through the metallic, spider-like conductor runs or heat radiation caused by a soldering plunger which may be used, will heat the soldering joints between the ends of the conductor runs formed as contact areas and bump or hump-like terminal contacts of the semiconductor chips, to such an extent that the solder will melt there and the solder joint will be interrupted. This danger is further increased by the possibility of such soldering operations being carried out not the supplier of a micropack but at the premises of a customer who may be less skilled in handling micropacks than the manufacturer.

The possibility soldering micropacks into an external wiring to be used only by the customer (for instance on a circuit board) has heretofore always been considered negatively by the producers of the micropacks. This is because this also requires the additional stocking of micropacks at the customer's premises over an extended period of time besides the danger mentioned above.

The tin soldering material, which used to be deposited currentlessly for developing good solderability on the external connecting contacts of the micropack, prevents the attainment of good solderability over the necessary extended period of time due to the formation of oxide and corrosion which sets in quickly. The solderability is, therefore, no longer sufficient after less than three weeks. A period of at least one year serves as a goal for obtaining good solderability.

As mentioned above, the tin used as the solder material used to be deposited currentlessly. While this can be done rather inexpensively, it leads to electrically unreliable behavior of the circuit in the form of breakdowns, short circuits and the like. This causes the formation of hair-like single crystal needles of tin during the currentless deposition, which is so-called "whisker formation".

It is accordingly an object of the present invention to provide a film-mounted circuit or micropack and a method for fabricating the same, which overcome the hereinafore-mentioned disadvantages of the heretofore-known circuits and methods of this type, which permit soldering to the external lead contacts of carrier films of micropacks without jeopardizing the solder joint between the spider-like metallic conductor runs and the terminal contacts of the semiconductor chips, and which make it possible for the manufacturer to maintain solderability to the external contact terminals for a substantially longer period of time than was customary heretofore. In addition, the electrical reliability of micropacks is to be increased by preventing the formation of the above-mentioned hair-like single-crystal needles. Furthermore, a method is to be provided which permits the fabrication of this advantageous film-mounted circuit.

With the foregoing and other objects in view, there is provided, in accordance with the invention, a film-mounted circuit, comprising a support film, metallic conductor runs formed of solderable material disposed on the support film, the conductor runs each having two ends, a contact area containing solder material electroplated on one of the ends and external terminal contacts containing solder material electroplated on the other of the ends for receiving a solder connection to external wiring, and a metallic semiconductor chip having bump or humplike terminal contacts each having a side with a surface area soldered to a respective one of the contact areas, the terminal contacts being formed of solderable material at least at the surface area thereof, the solderable material of the surface area of the terminal contacts forming an alloy together with the solder material of the contact areas deposited by electroplating during soldering, the alloy having an alloy ratio defined by a eutectic point, the melting point temperature of which is at least 20° C. above the melting point temperature of the solder material of the external terminal contacts but below a temperature at or above which the semiconductor chip is thermally damaged by the soldering.

In accordance with another feature of the invention, the support film is substantially formed of plastic or kapton.

In accordance with an added feature of the invention the metallic conductor runs include a region immediately adjacent the external terminal contacts being smaller than or small as compared to the length of the conductor runs and containing solder material deposited by electroplating.

In accordance with a further feature of the invention, the solder material deposited by electroplating is tin.

In accordance with an additional feature of the invention, the solder material deposited by electroplating is a lead-tin alloy with a lead content of up to 10 atom %.

In accordance with yet another feature of the invention, the solderable material of the terminal contacts is substantially formed of gold.

In accordance with yet an added feature of the invention, the solderable material of the terminal contacts is substantially formed of an alloy from the group consisting of a gold-copper alloy and a gold-silver alloy.

In accordance with yet a further feature of the invention, the solder material of the contact areas is different from that of the external terminal contacts.

In accordance with yet an additional feature of the invention, the thickness of the solder material of the external terminal contacts is 1 to 15 μm.

In accordance with still another feature of the invention, the thickness of the solder material of the contact areas is 1 to 15 μm prior to the soldering.

In accordance with still a further feature of the invention, the solder material is tin, the terminal contacts are formed of gold, and the amount of the solder material of the contact areas is such that the alloy ratio of the alloy formed by the soldering is 29.3 atom % tin corresponding to the eutectic point.

In accordance with again an added feature of the invention, the alloy produced by the soldering of the terminal contacts of the semiconductor chip with the solder material of the contact areas is formed only in a region being smaller then or small as compared to the volume of the terminal contacts.

In accordance with again a further feature of the invention, the region is ¼ to 1/20 of the volume of the terminal contacts of the semiconductor chip.

With the objects of the invention in view there is also provided a method for the fabrication of a film-mounted circuit or micropack, which comprises coating one entire principal surface of a support film with a metal foil formed of solderable material, applying a first photoresist layer over the entire surface of the metal foil, structuring the first photoresist layer by removing the photoresist layer at locations at which contact areas, external terminal contacts and optionally conductor runs of the finished micropack are to contain solder material, depositing solder material by electroplating on the locations at which the photoresist layer was removed forming the contact areas and the external terminal contacts, removing the remaining first photoresist layer applying a second photoresist layer over the entire exposed surface of the metal foil, the contact areas and the external terminal contacts, structuring the second photoresist layer while leaving photoresist covering the contact areas and the external terminal contacts as well as locations at which the conductor runs of the finished micropack are to be located, structuring the conductor runs by etching off the metal foil at the locations which are free of the second photoresist layer, removing the remaining second photoresist layer, soldering hump-like metallic terminal contacts of a semiconductor chip to the contact areas of the support film at a temperature which is at least 20° C. above the melting point temperature of the solder material deposited by electroplating but just below a value at which the semiconductor chip is not yet damaged, and forming an alloy at least in an area in which the solder joint is produced with an alloying ratio corresponding to an alloying ratio defined by a eutectic point.

In accordance with another mode of the invention, there is provided a method which comprises selecting materials for the solderable material of the terminal contacts and the solder material which can be deposited by electroplating having an alloy with at least one eutectic point depending on the alloying ratio, in which the melting temperature is at least 20° C. above the melting temperature of the solder material of the external terminal contacts but below a value at which the semiconductor chip is not yet changed.

In accordance with a further mode of the invention, there is provided a method which comprises depositing tin by electroplating as the solder material.

In accordance with an added mode of the invention, there is provided a method which comprises depositing a lead-tin alloy with a lead content of up to 10 atom % by electroplating as the solder material.

In accordance with an additional mode of the invention, there is provided a method which comprises forming the support film predominantly of plastic or kapton.

In accordance with yet another mode of the invention, there is provided a method which comprises forming the metallic terminal contacts substantially of gold at least in a surface area of a side thereof being soldered to the contact areas.

In accordance with yet an added mode of the invention, there is provided a method which comprises forming the metallic terminal contacts substantially of an alloy from the group consisting of a gold-copper alloy and a silver-gold alloy at least in a surface area of a side thereof being soldered to the contact areas.

In accordance with yet an additional mode of the invention, there is provided a method which comprises depositing a different solder material by electroplating for the contact areas than for the external terminal contacts.

In accordance with still an added mode of the invention, there is provided a method which comprises depositing the solder material with a thickness of 1 to 15 μm.

In accordance with still another mode of the invention, there is provided a method which comprises depositing the solder material over the entire surface of the contact areas and the external terminal contacts.

In accordance with still an additional mode of the invention, there is provided a method which comprises forming the solder material of tin, forming the terminal contacts of gold, and adjusting the amount of solder material so that the alloy produced by the soldering of the two materials contains 29.3 atom % tin corresponding to the eutectic point phase.

In accordance with yet an added mode of the invention, there is provided a method which comprises adjusting the amount of solder material deposited on the contact areas with respect to the quantity of solderable materials of the terminal contacts for developing an alloy by soldering the two materials with an alloying ratio corresponding to the alloying ratio of the materials at the eutectic point, only in a region being smaller than or small as compared to the volume of the terminal contacts.

In accordance with a concomitant mode of the invention, there is provided a method which comprises forming the small region with a volume of ¼ to 1/20 the volume of the bump or hump-like terminal contacts.

The invention is applicable to all known support films with metallic conductor runs of solderable material. It is furthermore independent of the semiconductor technology which is applied in the semiconductor chip being used. The only condition is that the material used is solderable, at least in the vicinity of the bump or hump-like terminal contacts in which the soldering operation takes place and that this material forms an alloy together with the solder being used, which has a melting point temperature curve with at least one eutectic point in dependence on the alloying ratio. The eutectic point, on one hand is to be clearly above (for instance 20° C. above) the melting point of the conventional solders which are used when soldering external terminal contacts and on the other hand, the eutectic, point should not require soldering temperatures so high that the semiconductor chip is destroyed thermally during the soldering operation.

An ideal combination of materials of a bump or hump-like terminal contact and the solder material used is represented by the metals gold and tin. Tin has a melting point of approximately 230° C.; a suitable eutectic point of the corresponding alloy with gold is 29.3 atom % tin with a melting point of about 280° C. (see Hansen, Constitution of Binary Alloys, 1958, FIG. 135, Page 233). A further possible combination is represented by the use of lead-tin solder with a low lead content (approximately 10 atom % lead) as the solder material and of gold as the material for the metallic terminal contacts of the semiconductor chip. Instead of pure gold, gold-copper and gold-silver alloys can also be used.

Other features which are considered as characteristic for the invention are set forth in the appended claims.

Although the invention is illustrated and described herein as embodied in a film-mounted circuit and method for fabricating the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 5 is a top-plan view of a conductor run on a larger scale than FIG. 1, with a connecting area and an external connecting contact resting thereon:

FIGS. 6 to 12 are top-plan and cross-sectional views showing different stages during the manufacturing process according to the invention.

Figure 1:
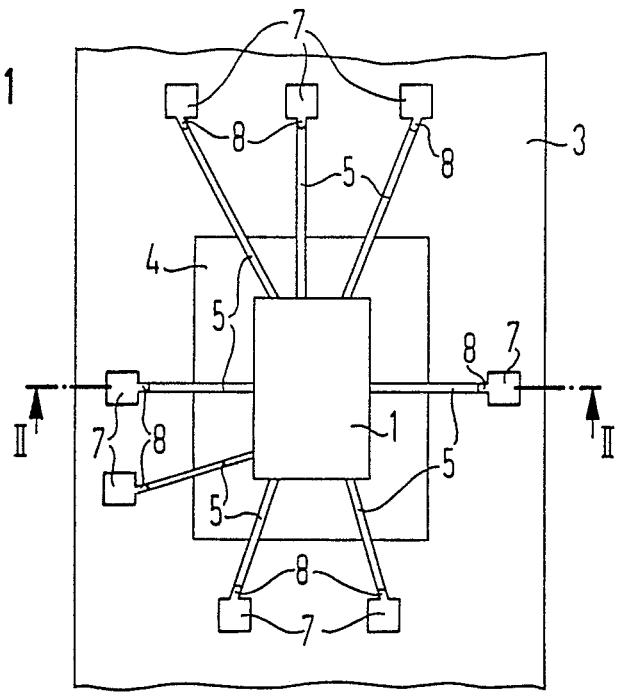
FIG. 1 is a fragmentary, diagrammatic, top-plan view of a micropack according to the invention, which is not drawn to scale in any of the figures.
Figure 2:
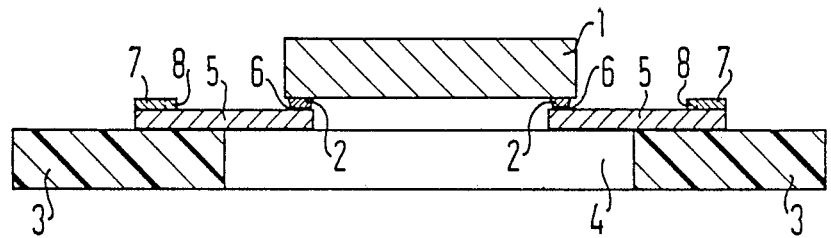
FIG. 2 is a cross-sectional view of the micropack taken along the line II—II in FIG. 1, in the direction of the arrows.

Referring now to the figures of the drawing in detail and first, particularly, to the top view of FIG. 1 and the cross section of FIG. 2, there is seen a semiconductor chip 1 disposed within a cutout 4 formed like a window in a support film 3. The support film 3 predominantly contains plastic, preferably kapton. However, it may also predominantly contain other substances, such as other thermally resistant plastics or ceramic materials. Conductor runs 5 which extend into the window-like cutout 4, are disposed on the support film 3. One end of each conductor run 5 within the window-like cutout 4 has a connecting or contact area 6 which serves for electrical connection to metallic, bump or hump-like terminal contacts 2 of the semiconductor chip 1. At the same time, these conductor runs 5 with their electrical connections also act to mechanically fix the semiconductor chip 1 relative to the support film 3. The conductor runs 5 contain predominantly to exclusively solderable material such as copper. Such conductor runs are customarily about 35 μm thick. The terminal contacts 2 of the semiconductor chip 1 contain a metal alloy which is generated by soldering the terminal contact 2 with solder material of the connecting areas 6.

Figure 4:
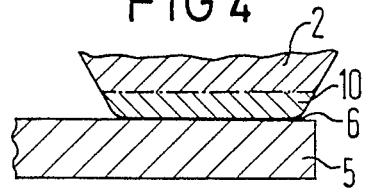
FIG. 4 is an enlarged view of a portion of FIG. 2, after soldering.

According to an advantageous further embodiment of the invention, the metal alloy is formed only in an area 10 which is small relative to the volume of the connecting contacts 2, as seen in FIG. 4. It is advantageous if the small area 10 is ¼ to 1/20 of the volume of the terminal contacts 2.

Figure 3:
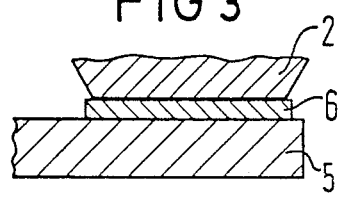
FIG. 3 is an enlarged view of a portion of FIG. 2, prior to soldering.

As is shown in FIG. 3, the starting material of the metal alloy on the side of the contact or connecting areas 6 is a solder material, and the starting material on the side of the terminal or connecting contacts 2 is a metal which can form an alloy during the soldering with an alloying ratio which corresponds to a eutectic point in which the melting point temperature of the alloy on one hand is at least 20° C. higher than that of the pure soldering material of the external terminal contact 7 and on the other hand, is still just below a value at which the semiconductor chip 1 is not yet damaged thermally when being soldered. An accurate value for the upper limit depends on the soldering time and the contact pressure exerted during soldering and on the semiconductor material of the semiconductor chip 1 being used. With a soldering time of 1 second and a contact pressure of 20 cN, the temperature is about 550° C. for silicon.

Tin and gold are available as a combination of the solder material and the metal of the connecting contacts 2. A gold-tin alloy with a tin content of 29.3 atom %, has a eutectic point with a melting temperature of approximately 280° C. which meets the above-mentioned condition. Instead of pure tin, the solder material can also contain a lead-tin alloy with a low lead content (approximately 10 atom % lead). Instead of gold, the terminal contacts 2 can also contain a gold-copper alloy or a gold-silver alloy. The terminal contacts 2 need not be formed completely of the selected metal prior to soldering: they may also contain a metallic layer sequence with the selected metal in a surface region on the side of a terminal contact 2, at which the soldering takes place. The structure of terminal contacts 2 formed of metallic layer sequences is generally known.

The use of electroplate-deposited solder material instead of solder deposited without current, has the following important advantages, among others:

(a) Surfaces of solder deposited by electroplating remain solderable for a longer time: at least one year as compared with two or at most three weeks in solders deposited without current, (b) Solders deposited without current form laterally extending single crystal needles during the deposition ("whisker formation" which may be 1 to 2 $\mu$m thick, 5 to 30 $\mu$m long). With the contact areas 6 which are customary today, such needles can easily form short circuits. This does not occur with deposition by electroplating.

(c) Greater solder thicknesses can be achieved with deposition through electroplating.

As is shown in FIGS. 1 and 2 and particularly in FIG. 5, there are external connecting contacts 7 at the end of the conductor runs 5 opposite the areas 6 customarily having the same solder material, which is also advantageously deposited by electroplating. The solder material can also cover the conductor run in a region 8 that is small as compared to the total length of the conductor run 5. The material of the conductor run 5 is continued over the entire surface thereof underneath the solder material of the external connecting contacts 7. The same advantages apply in the use of solder deposited by electroplating for the external connecting contacts 7, as for the contact areas 6.

According to an advantageous further embodiment of the invention, it is also possible for the solder material of the external terminal contacts 7 to be different from that of the contact areas 6. The thickness of the solder material deposited on the contact areas 6 and the external connection contacts 7 is advantageously 1 to 15 $\mu$m.

Since the basic idea of the teachings of the present invention is independent of the material and the structure of the support film 3, a film-mounted circuit having the features described above and which has a support film 3 without the window-like cutout 4, is also within the scope of the invention. Naturally, the conductor runs 5 are then completely disposed on the support film 3.

The combination of the features which are essential for the invention, such as "the use of solder material and material of the terminal contacts 2", which meet the above-mentioned temperature conditions regarding the eutectic point as well as "the use of solder materials deposited by electroplating" make it possible for the manufacturer of micropacks to develop a new market: It is now possible to sell micropacks without the external wiring connected to the external terminal contacts 7. The customer can then make the connection later by means of soldering in a temperature range which is between the melting point of the solder applied to the external terminal contacts 7 and that of the metal alloy 10, without the fear that the solder joints between the terminal contacts 2 of the semiconductor chips 1 and the terminal surfaces 6 will open. Furthermore, the customer can make the connection up to one year after the micropack has been manufactured, without the device suffering from poor solderability.

With the reference to FIGS. 6 to 12, the circuit according to the invention is manufactured as follows: A window-like cutout is formed in a support film 3 made of one of the above-mentioned materials, such as by cutting or punching. A main surface of the support film 3 is then coated over the entire surface, i.e. including the window-like cutout 4, with a metal foil 15 of solderable material. For this purpose, a copper foil with a thickness of about 35 $\mu$m can be used. This is done according to the state of the art. FIG. 8 shows the future micropack after this process step; the window-like cutout 4 which is covered by the metal foil 15, is shown by broken lines.

While it is customary in film-mounted circuits to make the window-like cutout 4, it can definitely be omitted.

As shown in FIGS. 9 and 10, the entire surface of the metal foil 15 then receives a first photoresist layer 9 which is structured by conventional means in such a manner that areas 16, 17, 18 are again freed of the photoresist layer 9. However, in the finished micropack the areas 16, 17, 18 are located in the contact areas 6 which contain solder material, the external terminal contacts 7 and optionally the region 8 which is physically adjacent the external terminal contacts 7 and is very short as compared to the length of the conductor runs 5. Solder material is then deposited on the metal foil 15 by electroplating at the points 16, 17, 18 exposed by removing the first photoresist layer 9. According to by electroplating. In an advantageous further embodiment of the invention, a different solder material can be deposited on the points 16 and 18 than on the points 17. The solder material is advantageously deposited with a thickness of 1 to 15 $\mu$m. The solder material which is used in this case, in particular for the future connecting area 6, is a metal that can form an alloy in connection with the metal of the terminal contacts 2. The alloy ratio of the metal corresponds to a eutectic point at which the corresponding melting temperature on one hand is at least 20° C. above that of the solder material used for the future external terminal contacts 7, and on the other hand is still below a value at which the semiconductor chip 1 will not yet be thermally damaged when the solder material is soldered to the terminal contacts 2. The exact value for the upper limit depends on the soldering time and the contact pressure exerted during soldering, as well as on the semiconductor material used for the semiconductor chip 1. For a soldering time of 1 second and a contact pressure of 20 cN, the temperature is about 550° C. for silicon. Tin or a lead-tin alloy with a low lead content (approximately 10 atom % lead) are suitable as solder materials. Gold or a gold-copper or gold-silver alloy is preferably used as the material for the terminal contacts 2 during the fabrication of the semiconductor chip 1, at least at a surface area of one side on which the solder joint is to be made.

Figure 12:
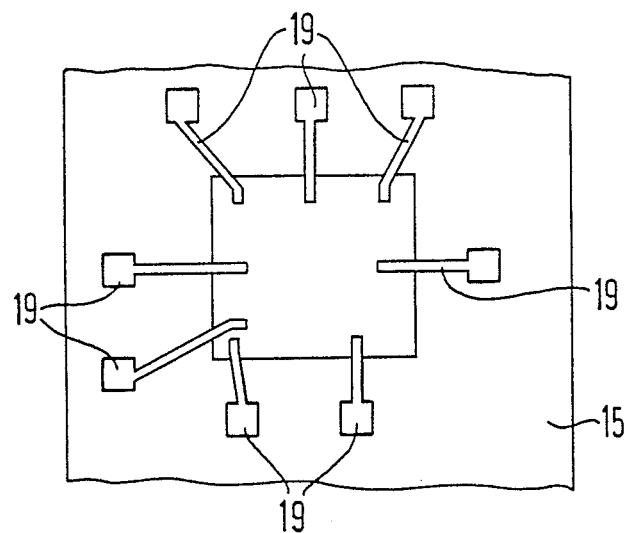

The deposition of the solder material by electroplating is followed by the removal of the residual first photoresist layer 9 by conventional means. The result of this processing step is shown in FIG. 11. A second photoresist layer is then applied to the metal foil 15 and the solder material deposited by electroplating, and is structured in such a manner that the points at which the contact areas 6, the external terminal contacts 7, optionally the very short regions 8, as well as the conductor runs 5 of the finished micropack are located, remain covered with photoresist 19 as is shown in FIG. 12. The metal foil 15 is subsequently structured by conventional means in such a manner that, in addition to the contact areas 6 generated by the electroplating deposition and in addition to the external terminal contacts 7 which are optionally followed by the very short regions 8, the conductor runs 5 are generated. The second photoresist layer is to be structured in this case in such a manner that during the subsequent structuring of the metal foil 15, at least the solder material deposited by electroplating on the contact surfaces 6, is not structured at the same time. This could take place, for instance, by isotropic underetching. In practice, this means that the structured second photoresist layer 19 covers more than the desired base area of the contact surface 6, creating an "overlap".

A simple rule of thumb for dimensioning this overlap relative to an outline of every contact area 6, is that the photoresist 19 should have an overlap dimension there which is at least one half the added thicknesses of the solder material deposited by electroplating and the metal foil 15.

Figure 13:
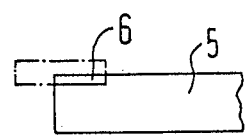
FIG. 13 is a fragmentary top-plan view showing the offset of a connecting area relative to a conductor run, caused by the maladjustment of photoresist layers.

In accordance with the invention, it is also permissible to structure the second photoresist layer at the contact areas 6 in such a manner that, the contact area 6 is completely surrounded by the surface of the corresponding conductor run 5 after the structuring of the metal foil 15, as seen in the top view of FIG. 5. In principle, however, it is very important that the structuring of the first photoresist layer 9 and the structuring of the second photoresist layer are geometrically adjusted to each other so exactly (for instance by an appropriately exact adjustment of the photomasks used), that no mutual misalignment occurs. This is because in the event of a mutual misalignment, part of the previously deposited solder material would be removed during the structuring of the metal foil 15 at the contact surfaces 6, so that a structure of the solder material of the contact areas 6 with respect to the terminal contacts 2 which will be described further below would no longer be correct. Such an offset, generated for instance, by maladjustment of photomasks, is shown in FIG. 13. The part of the contact area 6 shown in phantom is structured concurrently when the metal foil 15 is being structured, i.e. the contact surface 6 becomes impermissibly smaller. After the metal foil 15 is structured, the remaining second photoresist layer 19 is removed.

The terminal contacts 2 of the semiconductor chip 1 are then soldered to the terminal areas 6. This is customarily done with a contact pressure of 20 cN and a typical soldering time of 1 second.

According to the teachings of the present invention, an attempt is made to generate an alloy by performing the soldering operation generating the solder joint. The alloying ratio of the alloy corresponds to the alloy ratio which is exhibited by a eutectic alloy of the materials used (for instance tin and gold). On one hand, the melting point of the alloy is at least 20° C. above the melting point of the solder material of the external terminal contacts 7 and on the other hand, as already described above, it is still just below a value at which the semiconductor chip 1 is not yet damaged thermally during the soldering. In order to obtain this eutectic alloy, the following conditions must be fulfilled:

(a) The materials to be used must be selected in such a manner that an alloy can be produced with a eutectic in the temperature range mentioned above, (b) The soldering temperature must be above the melting point of the eutectic, and (c) The mass contents of the materials used must be matched to each other in such a way that the eutectic can form.

It will be shown below by referring to an example, how the mass content of the materials to be used (in this case gold and tin) can be determined: Assuming that the area of a terminal contact 2, to which a terminal area 6 is to be soldered, has the measurements of 120×120×18 μm (i.e. for instance, that the entire terminal contact 2 is formed of gold), the gold weighs 4 μg In order to obtain the eutectic point at 29.3 atom % tin (corresponding to 20% by weight) during the soldering, the tin must be adjusted to 1 μg. With an assumed thickness of the tin of 3 μm, this corresponds to a contact area 6 of 200×200 μm to be tinned.

According to an advantageous further embodiment of the invention, it is not advisable to determine the solder material with respect to the total solderable material of a terminal contact 2, but to rather select it in such a way that the alloy with the alloying ratio mentioned is only is formed during the soldering in an area 10 (see FIG. 4) which is approximately ¼ to 1/20 of the volume of the terminal contact 2. First, this has thermal advantages for the semiconductor chip 1 and second, a possible material distortion which is possible in the semiconductor chip 1 at the terminal contacts 2 is avoided during soldering. The melting of the terminal contacts 2 together during soldering is also avoided, so that a spacing between the semiconductor chip 1 and the conductor runs 5 may be reduced due to the contact pressure used (for instance 20 cN), since this could lead to undesirable electrical short circuits between the semiconductor chip 1 and the conductor runs 5.

The foregoing is a description corresponding in substance to German Application No. P 35 06 581.8 dated Feb. 25, 1985, the International priority of which is being claimed for the instant application, and which is hereby made part of this application. Any material discrepancies between the foregoing specification and the aforementioned corresponding German application are to be resolved in favor of the latter.

I claim:

1. Film-mounted circuit, comprising a support film, metallic conductor runs formed of solderable material disposed on said support film, said conductor runs each having two ends, a contact area containing solder material electroplated on one of said ends and external terminal contacts containing solder material electroplated on the other of said ends for receiving a solder connection to external wiring, and a metallic semiconductor chip having hump-like terminal contacts each having a side with a surface area soldered to a respective one of said contact areas, said terminal contacts being formed of solderable material at least at said surface area thereof, said solderable material of said surface area of said terminal contacts forming an alloy together with said solder material of said contact areas deposited by electroplating during soldering, said alloy having an alloy ratio defined by a eutectic point, the melting point temperature of which is at least 20° C. above the melting point temperature of said solder material of said external terminal contacts but below a temperature at which said semiconductor chip is thermally damaged by the soldering.

2. Film-mounted circuit according to claim 1, wherein said support film is substantially formed of plastic.

3. Film-mounted circuit according to claim 1 wherein said metallic conductor runs include a region immediately adjacent said external terminal contacts being smaller than the length of the conductor runs and containing solder material deposited by electroplating.

4. Film-mounted circuit according to claim 1, wherein said solder material deposited by electroplating is tin.

5. Film-mounted circuit according to claim 1, wherein said solder material deposited by electroplating is a lead-tin alloy with a lead content of up to 10 atom %.

6. Film-mounted circuit according to claim 1, wherein said solderable material of said terminal contacts is substantially formed of gold.

7. Film-mounted circuit according to claim 1, wherein said solderable material of said terminal contacts is substantially formed of an alloy from the group consisting of a gold-copper alloy and a gold-silver alloy.

8. Film-mounted circuit according to claim 1, wherein said solder material of said contact areas is different from that of said external terminal contacts.

9. Film-mounted circuit according to claim 1, wherein the contacts is 1 to 15 μm.

10. Film-mounted circuit according to claim 1, wherein the thickness of said solder material of said contact areas is 1 to 15 μm prior to the soldering.

11. Film-mounted circuit according to claim 1, wherein said solder material is tin, said terminal contacts are formed of gold, and the amount of said solder material of said contact areas is such that the alloy ratio of the alloy formed by the soldering is 29.3 atom % tin corresponding to the eutectic point.

12. Film-mounted circuit according to claim 1, wherein said alloy produced by the soldering of said terminal contacts of said semiconductor chip with said solder material of said contact areas is formed only in a region being smaller then the volume of said terminal contacts.

13. Film-mounted circuit according to claim 12, wherein said region is ⅓ to 1/20 of the volume of said terminal contacts of said semiconductor chip.

* * * * *